(12) United States Patent
Saltas et al.

(10) Patent No.: US 10,566,134 B2
(45) Date of Patent: Feb. 18, 2020

(54) APPARATUS, SYSTEM, AND METHOD FOR HANDLING MAGNETIC DEVICES

(71) Applicant: Intel Corporation, Santa Clara, CA (US)

(72) Inventors: Mark Saltas, Buckeye, AZ (US); Amanuel M Abebaw, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 15/640,040

(22) Filed: Jun. 30, 2017

(65) Prior Publication Data

US 2019/0006097 A1  Jan. 3, 2019

(51) Int. Cl.
*B25J 15/06* (2006.01)
*B65G 47/91* (2006.01)
*H01F 41/02* (2006.01)

(52) U.S. Cl.
CPC .......... *H01F 41/02* (2013.01); *B25J 15/0616* (2013.01); *B65G 47/912* (2013.01)

(58) Field of Classification Search
CPC ...... B25J 15/009; B25J 15/0616; B65G 47/91
See application file for complete search history.

(56) References Cited

U.S. PATENT DOCUMENTS

| | | | | |
|---|---|---|---|---|
| 4,950,011 A | * | 8/1990 | Borcea | H05K 13/0413 294/2 |
| 6,279,225 B1 | * | 8/2001 | Martin | H05K 13/0452 29/740 |
| 7,453,259 B2 | * | 11/2008 | Hoppe | G01R 1/0408 324/756.02 |
| 7,793,408 B2 | * | 9/2010 | Oh | H01L 21/6838 29/743 |
| 2010/0200405 A1 | * | 8/2010 | Lenz | B03C 1/0332 204/600 |

OTHER PUBLICATIONS

Magnetic Properties of Stainless Steel, May 1, 2000, SSAS Information Sheet No. 2.81, Issue 01, p. 1 (Year: 2000).*

* cited by examiner

*Primary Examiner* — Gerald McClain
(74) *Attorney, Agent, or Firm* — Schwegman Lundberg & Woessner, P.A.

(57) ABSTRACT

An apparatus for positioning magnetic components may include a base. The base may include an upper surface. The base may include a lower surface. The base may include a contact surface. The base may include a vacuum line in communication with the upper surface and the contact surface. The base may include a first pin. The base may include a second pin. The first pin and the second pin may be positioned adjacent the contact surface. The first pin and the second pin may protrude from the lower surface of the base. The base may be configured to generate a vacuum at the contact surface when a vacuum is applied to the vacuum line.

3 Claims, 4 Drawing Sheets

APPARATUS, SYSTEM, AND METHOD FOR HANDLING MAGNETIC DEVICES

BACKGROUND

Magnetic devices may be used in a variety of applications. The magnetic devices may be stored and transported in a variety of ways (e.g., stacked in a tube or shrink-wrapped to a substrate). Automatic operations (e.g., pick and place) may be used during the fabrication of electronics that use the magnetic devices as components.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
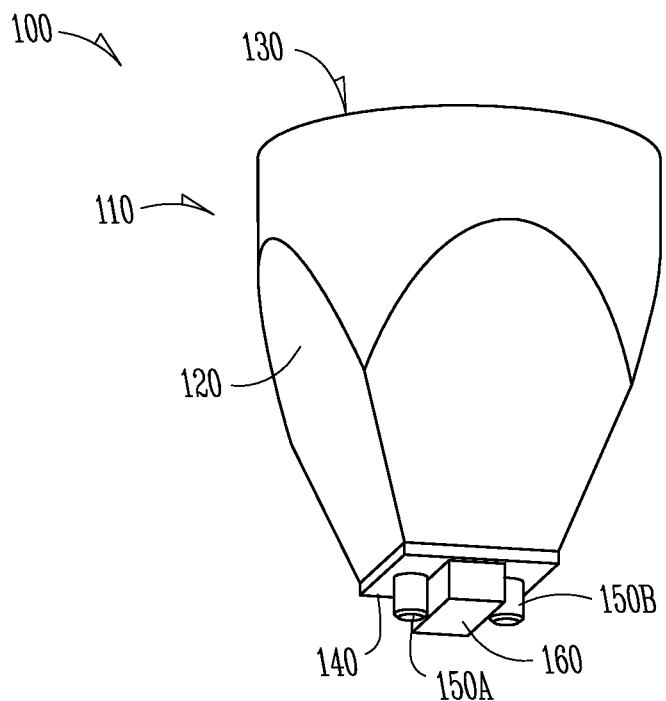
FIG. 1 illustrates a portion of a system for handling magnetic devices.

The present inventors have recognized, among other things, that a problem to be solved may include the placement of magnetic devices on or near a ferrous material. The present inventors have recognized, among other things, that a problem to be solved may include the unintended movement or reorientation of a magnetic device due to the interaction of the magnetic device with external magnetic fields or materials.

The present subject matter may help provide a solution to this problem, such as by an apparatus for positioning magnetic component. The apparatus for positioning magnetic component may include a base. The base may include an upper surface. The base may include a lower surface. The base may include a contact surface. The base may include a vacuum line in communication with the upper surface and the contact surface. The base may include a first pin. The base may include a second pin. The first pin and the second pin may be positioned adjacent the contact surface. The first pin and the second pin may protrude from the lower surface of the base. The base may be configured to generate a vacuum at the contact surface when a vacuum is applied to the vacuum line.

In an example, a magnetic device may be positioned using a pick and place mechanism that mates with the magnetic device. The mechanism may apply a vacuum to the contact surface mated with the magnetic device. The mechanism may then elevate the magnetic device and move the magnetic device toward a target position. As the mechanism and the magnetic device are moved toward the target position, external influences (e.g., the interaction of the magnetic device with external magnetic fields, or the interaction of the magnetic device with a ferrous material proximate the magnetic device) may cause the magnetic device to move or otherwise reorient itself. The external influences may overcome the vacuum force that maintains the mated configuration of the magnetic device with the mechanism, thereby causing movement or reorientation. Movement or reorientation of the magnetic device may be undesirable if it were desired to have the magnetic device placed at a target position in the same orientation as the magnetic device was mated with the mechanism.

The present subject matter may help provide a solution to this problem, such as by providing the pins adjacent the contact surface. The pins may straddle the magnetic device. The pins may interfere with the undesirable movement or reorientation of the magnetic device by providing a physical impediment to the movement or reorientation of the magnetic device.

Aspect 1 may include or use subject matter (such as an apparatus, a system, a device, a method, a means for performing acts, or a device readable medium including instructions that, when performed by the device, may cause the device to perform acts), such as may include or use an apparatus ("the apparatus") for positioning magnetic components. The apparatus may include a base. The base may include an upper surface. The base may include a lower surface. The base may include a contact surface. The base may include a vacuum line. The vacuum line may be in communication with the upper surface and the contact surface. The base may include a first pin. The base may include a second pin. The first pin and the second pin may be positioned adjacent the contact surface. The first pin and the second pin may protrude from the lower surface of the base. The base may be configured to generate a vacuum at the contact surface when a vacuum is applied to the vacuum line.

Aspect 2 may include or use, or may optionally be combined with the subject matter of Aspect 1, to optionally include or use a vacuum pocket. The vacuum pocket may form a recess in the lower surface of the base. The vacuum pocket may be in communication with the vacuum line. The vacuum pocket may include the contact surface. The vacuum pocket may be configured to produce a vacuum at the contact surface when a vacuum is applied to the vacuum line. The recess may be configured to receive a portion of a magnet.

Aspect 3 may include or use, or may optionally be combined with the subject matter of one or any combination of Aspects 1 or 2 to optionally include or use that the first pin may be positioned adjacent a first side of the contact surface. The second pin may be positioned adjacent a second side of the contact surface.

Aspect 4 may include or use, or may optionally be combined with the subject matter of Aspect 3 to optionally include or use that the first side of the contact surface may be opposite the second side of the contact surface.

Aspect 5 may include or use, or may optionally be combined with the subject matter of one or any combination of Aspects 1 through 4 to optionally include or use a third pin and/or a fourth pin. The third pin may protrude from the lower surface of the base. The fourth pin may protrude from the lower surface of the base. The third pin may be positioned adjacent a third side of the contact surface. The fourth pin may be positioned adjacent a fourth side of the contact surface.

Aspect 6 may include or use, or may optionally be combined with the subject matter of Aspect 5 to optionally include or use that the third side of the contact surface may be opposite the fourth side of the contact surface.

Aspect 7 may include or use, or may optionally be combined with the subject matter of one or any combination of Aspects 1 through 6 to optionally include or use that the first pin and the second pin may have a relative magnetic permeability of less than 10.

Aspect 8 may include or use, or may optionally be combined with the subject matter of one or any combination of Aspects 1 through 7 to optionally include or use that the first pin and the second pin may include stainless steel or a polymer.

Aspect 9 may include or use, or may optionally be combined with the subject matter of one or any combination of Aspects 1 through 8 to optionally include or use that the lower surface and the contact surface nay be coplanar.

Aspect 10 may include or use subject matter (such as an apparatus, a system, a device, a method, a means for performing acts, or a device readable medium including instructions that, when performed by the device, may cause the device to perform acts), such as may include or use a system ("the system") for positioning magnetic components. The system may include a base. The base may include an upper surface. The base may include a lower surface. The base may include a contact surface. The base may include a vacuum line. The vacuum line may be in communication with the upper surface and the contact surface. The base may include a first pin. The base may include a second pin. The first pin and the second pin may be positioned adjacent the contact surface. The first pin and the second pin may protrude from the lower surface of the base.

The system may include a magnet. The magnet may have a thickness. The thickness may be the largest dimension of the magnet. The system may include a vacuum source. The vacuum source may be coupled to the vacuum line. The vacuum source may be configured to generate a pressure less than atmospheric pressures. The system may include a first target surface. The first target surface may include a first target position. The first target surface may be configured to mate with the magnet at the first target position. The contact surface may be configured to mate with the magnet. The base may be configured to generate a vacuum at the contact surface when a vacuum is applied to the vacuum line.

Aspect 11 may include or use, or may optionally be combined with the subject matter of Aspect 10, to optionally include or use that the first pin and the second pin may be spaced apart at a first distance.

Aspect 12 may include or use, or may optionally be combined with the subject matter of Aspects 11 to optionally include or use that the first distance between the first pin and the second pin may be less than the thickness of the magnet.

Aspect 13 may include or use, or may optionally be combined with the subject matter of one or any combination of Aspects 10 through 12 to optionally include or use that the first target surface may include a ferrous material.

Aspect 14 may include or use, or may optionally be combined with the subject matter of one or any combination of Aspects 10 through 13 to optionally include or use that a vacuum pocket. The vacuum pocket may form a recess in the lower surface of the base. The vacuum pocket may be in communication with the vacuum line. The vacuum pocket may include the contact surface. The vacuum pocket may be configured to produce a vacuum at the contact surface when a vacuum is applied to the vacuum line. The recess may be configured to receive a portion of a magnet.

Aspect 15 may include or use, or may optionally be combined with the subject matter of one or any combination of Aspects 10 through 14 to optionally include or use that the first pin may be positioned adjacent a first side of the contact surface. The second pin may be positioned adjacent a second side of the contact surface.

Aspect 16 may include or use, or may optionally be combined with the subject matter of Aspect 15 to optionally include or use that the first side of the contact surface may be opposite the second side of the contact surface.

Aspect 17 may include or use, or may optionally be combined with the subject matter of one or any combination of Aspects 10 through 15 to optionally include or use a second target surface. The second target surface may include a second target position.

Aspect 18 may include or use subject matter (such as an apparatus, a system, a device, a method, a means for performing acts, or a device readable medium including instructions that, when performed by the device, may cause the device to perform acts), such as may include or use a method for positioning magnetic components. The method may include positioning a base proximate a magnet. The magnet may be mated with a first target surface at a first target position. Positioning the base proximate the magnet may include positioning the magnet between a first pin and the second pin. The first pin and the second pin may extend from a lower surface of the base. The method may include mating a contact surface of the base with the magnet. The method may include applying a vacuum to a vacuum line. The vacuum line may be in communication with the contact surface. The method may include elevating the base. The application of the vacuum to the vacuum line may maintain the mated configuration of the magnet with the contact surface of the base while the base is elevated. The method may include positioning the base proximate a second target surface having a second target position. The method may include mating the magnet with the second target position.

Aspect 19 may include or use, or may optionally be combined with the subject matter of Aspect 18, to optionally include or use removing the vacuum that may be applied to the vacuum line.

Aspect 20 may include or use, or may optionally be combined with the subject matter of one or any combination of Aspects 18 or 19 to optionally include or use that the second target surface is the same as the first target surface.

Aspect 21 may include or use, or may optionally be combined with any portion or combination of any portions of any one or more of Aspects 1 through 20 to include or use, subject matter that may include means for performing any one or more of the functions of Aspects 1 through 20, or a machine-readable medium including instructions that, when performed by a machine, cause the machine to perform any one or more of the functions of Examples 1 through 20.

Each of these non-limiting examples may stand on its own, or may be combined in various permutations or combinations with one or more of the other examples. This overview is intended to provide an overview of subject matter of the present patent application. It is not intended to provide an exclusive or exhaustive explanation of the invention.

FIG. 1 illustrates a portion of a system 100 for handling magnetic devices. The system 100 may include an apparatus 110 for handling magnetic devices. The apparatus 110 may include a base 120. The base 120 may include a top surface 130. The top surface 130 may be configured with threads or other attachment mechanisms such that the base 120 is able to couple with machinery (e.g., pick and place machinery).

The base 120 may include a bottom surface 140. The base 120 may include a first pin 150A. The base 120 may include a second pin 150B. The system 100 may include a magnetic device 160. The base 120 may include a contact surface (not shown). The contact surface may be the surface of the base that is configured to mate with the magnetic device 160. The contact surface may be coplanar with the lower surface 140. The first pin 150A may be positioned adjacent the contact surface. The first pin 150B may be positioned adjacent the contact surface. The first pin and the second pin may protrude from the lower surface 140 of the base 120.

Figure 2:
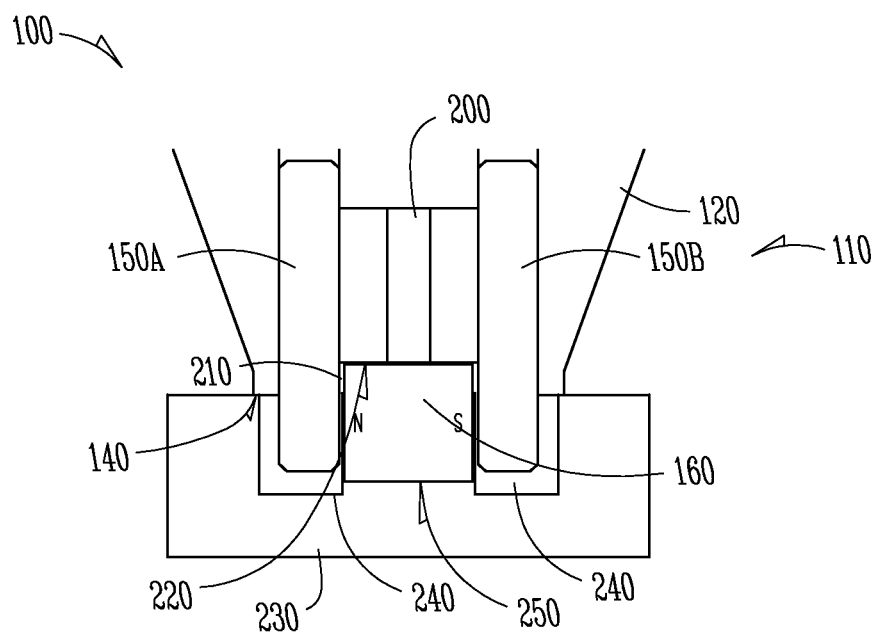
FIG. 2 illustrates a different portion of the system for handling magnetic devices of FIG. 1.

FIG. 2 illustrates a different portion of the system 100 for handling magnetic devices of FIG. 1. The system 100 may include the apparatus 110 for handling magnetic devices. The base 120 may include a vacuum line 200. The vacuum line may extend from the top surface 130 of FIG. 1 to the lower surface 140. The vacuum line 200 may be in communication with the lower surface 140. The base 120 may include the contact surface 220. The vacuum line 200 may extend from the top surface 130 of FIG. 1 to the contact surface 220. The vacuum line 200 may be in communication with the contact surface 220. Applying a vacuum to the vacuum line 200 may cause a vacuum to be generated at the lower surface 140 and/or the contact surface 220. The contact surface 220 may be coplanar with the lower surface 140.

The base 120 may include a vacuum pocket 210. The vacuum pocket 210 may be configured to receive a portion of the magnetic device 160. The vacuum pocket 210 may include the contact surface 220. The vacuum pocket 210 may be configured to produce a vacuum at the contact surface 220 when a vacuum is applied to the vacuum line 200.

The first pin 150A may be positioned adjacent a first side of the contact surface 220. The second pin 150B may be positioned adjacent a second side of the contact surface 220. The first side of the contact surface 220 may be opposite the second side of the contact surface 220. The base 120 may include a third pin (not shown). The base 120 may include a fourth pin (not shown). The third pin may protrude from the lower surface 140 of the base 120. The fourth pin may protrude from the lower surface 140 of the base 120. The third pin may be positioned adjacent a third side of the contact surface 220. The fourth pin may be positioned adjacent a fourth side of the contact surface 220. The third side of the contact surface 220 may be opposite the fourth side of the contact surface 220. The first pin 150A, the second pin 150B, the third pin, and the fourth pin may be configured to straddle the magnetic device 160.

The first pin 150A and the second pin 150B may have a relative magnetic permeability of less than 10. Configuring the first pin 150A or the second pin 150B to have a relative magnetic permeability of less than 10 may allow for the magnet 160 to not interact with (e.g., stick to) the first pin 150A and/or the second pin 150B. The first pin 150A and the second pin 150B may include stainless steel or a polymer. The first pin 150A and the second pin 150B may include a 304 series austenitic stainless steel material. Configuring the first pin 150A or the second pin 150B to include stainless steel or a polymer may allow for the magnet 160 to not interact with (e.g., stick to) the first pin 150A and/or the second pin 150B.

The magnetic device 160 may be positioned at, or within, a first target surface 230. The first target surface 230 may include a first target position 250. The base 120 may be positioned proximate the magnetic device 160 when the magnetic device 160 is located at the first target position 250. The first target surface 230 may be configured to mate with the magnetic device 160 at the first target position 250. The first target surface 230 may include one or more recesses 240 configured to receive the first pin 150A and/or the second pin 150B. The first target surface 230 may be configured to have the same number of recesses 240 as the number of pins included in the base 120. The recesses 240 of the first target surface 230 may allow for the first pin 150A and/or the second pin 150B to be received by the first target surface 230, thereby allowing the contact surface 220 (or the lower surface 140) to mate with the magnetic device 160.

Figure 3:
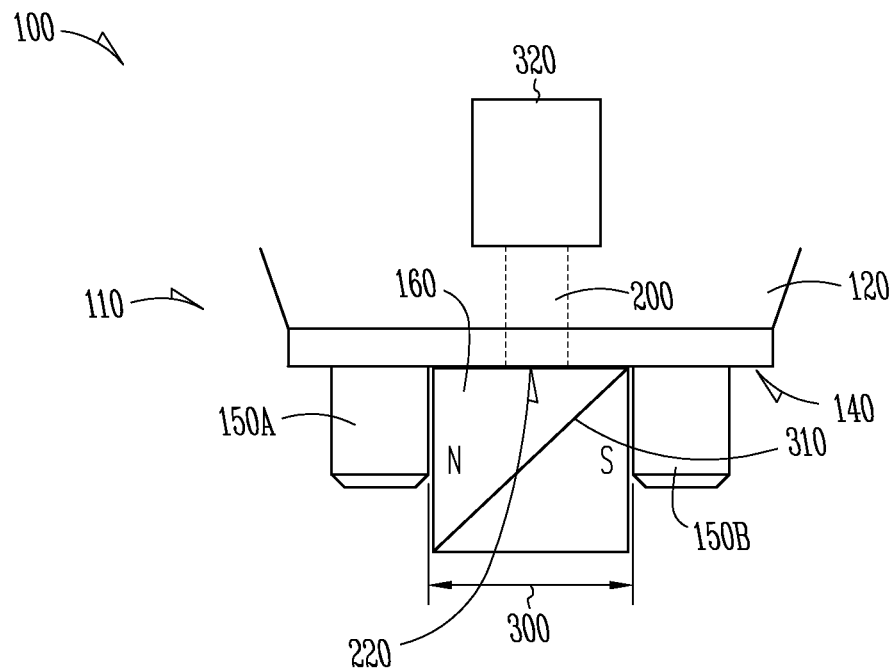
FIG. 3 illustrates a different portion of the system for handling magnetic devices of FIG. 1.

FIG. 3 illustrates a different portion of the system 100 for handling magnetic devices of FIG. 1. The system 100 may include the apparatus 110. The system 100 may include a vacuum source 320. In an example, FIG. 3 illustrates the apparatus 110 in an elevated position, wherein a vacuum applied to the contact surface 220, via the vacuum line 200, retains the mated configuration of the magnet 160 against the contact surface 220. The vacuum may be generated by the vacuum source 320. The vacuum source 320 may generate a vacuum force on the magnetic device 160, wherein the vacuum force is configured to overcome the force of gravity acting upon the magnetic device 160. Stated another way, application of a vacuum to the vacuum line 200 may maintain the mated configuration of the magnetic device 160 with the contact surface 220 of the base 120 while the base 120 is elevated. The system 100 may be used to transport the magnetic device 160 from the first target position 250 of FIG. 2, to the second target position of FIG. 4.

The first pin 150A and the second pin 150B may be spaced at a first distance 300. The first pin 150A and the second pin 150B may be spaced at a second distance. The first distance 300 and the second distance may be different. The first distance 300 may be greater than a length or a width of the magnetic device 160. Configuring the first distance 300 to be greater than a length or width of the magnetic device 160 may allow for the first pin 150A and the second pin 150B to straddle the magnetic device 160. Stated another way, the magnetic device 160 may be positioned between the first pin 150A and the second pin 150B. The first distance 300 may be less a thickness 310 of the magnetic device 310. The thickness 310 may be the greatest dimension of the magnetic device 310. Configuring the first distance 300 to be less than the thickness 310 may allow for the magnetic device 160 to engage with the first pin 150A and the second pin 150B, instead of falling, moving, rotating, or otherwise reorienting itself.

In an example, the magnetic device 160 is a cube and has an equal length, width, and height. The thickness 310 may be the dimension that extends from diagonally opposing corners of the magnetic device 160. Stated another way, a square face of the magnetic device 160 may be decomposed into two triangles. The thickness 310 may be the hypotenuse of the triangles. Because the hypotenuse of a triangle may have a greater dimension than the legs of the triangle, the thickness 310 may correspond to the hypotenuse. Although the present example describes the magnetic device 160 as a cube, the magnetic device 160 may be any geometric or amorphous shape. The thickness 310 may be the greatest dimension of the magnetic device 310 that is straddled by the first pin 150A and the second pin 150B.

Figure 4:
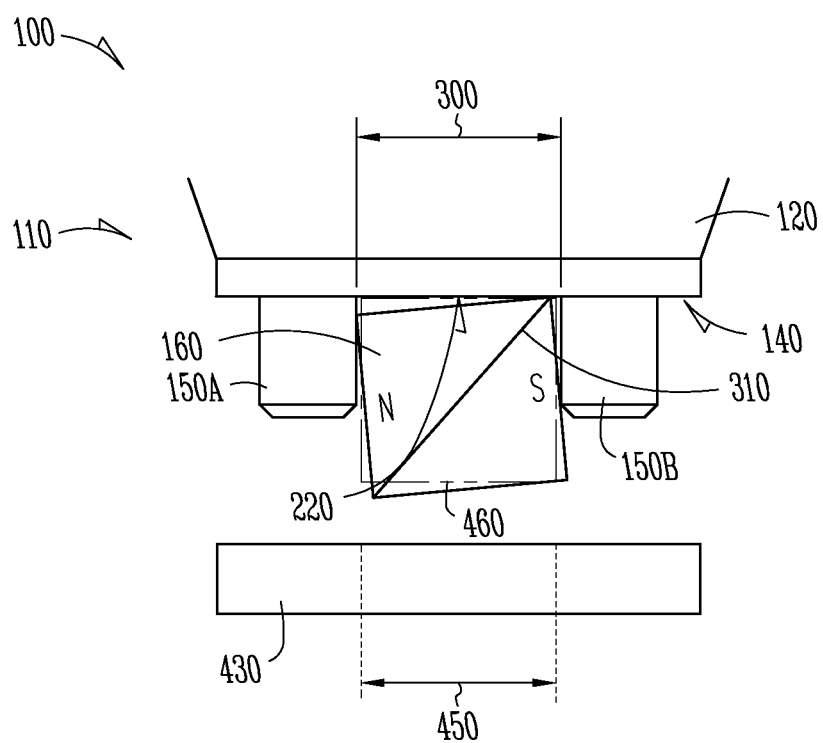
FIG. 4 illustrates a different portion of the system for handling magnetic devices of FIG. 1.
Figure 6:
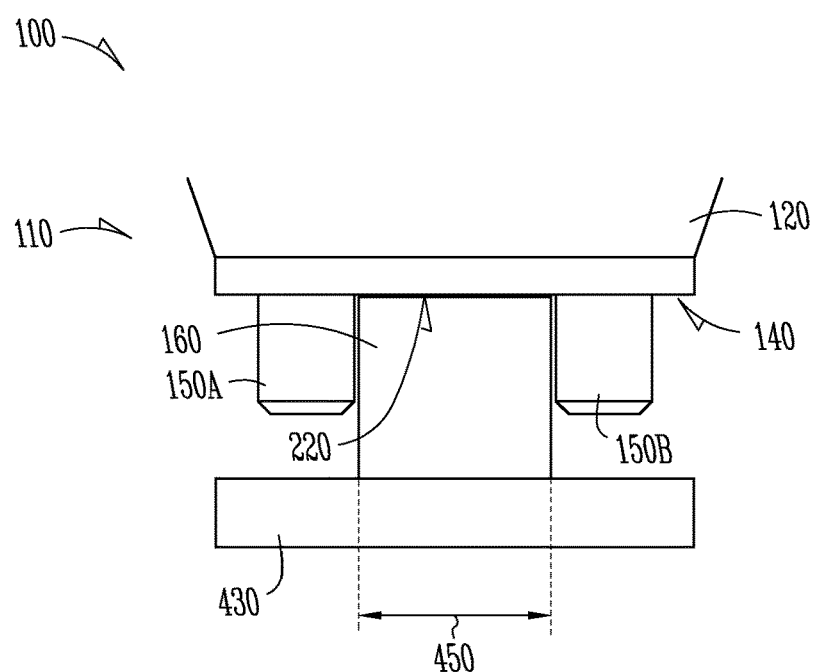
FIG. 6 illustrates a different portion of the system for handling magnetic devices of FIG. 1.

FIG. 4 illustrates a different portion of the system 100 for handling magnetic devices of FIG. 1. FIG. 4 shows the magnetic device 160 and the base 120 in an elevated state. As the apparatus 100 transports the magnetic device 160, the magnetic device 160 may experience external influences from external magnetic fields, or interact with nearby ferromagnetic materials, such as iron, nickel, or cobalt. The external influences may cause the magnetic device 160 do de-mate (e.g., separate) from the contact surface 220, such as during transit from the first target position 250 of FIG. 2 to a second target position 450 of a second target surface 430. In an example, the magnet 160 may be in a tilted configuration in comparison to an intended configuration 460 of the magnet 160. The de-mating of the magnetic device 160 may cause the magnetic device 160 to be placed out of position (e.g., by not being located at the second target position 450) or at the wrong orientation (e.g., by having the polarities of the magnetic device 160 not oriented parallel to the second target surface 430, as shown in FIG. 6). The vacuum source 320 and the apparatus 100 may be configured to allow for the magnetic device 160 to remain in an elevated state, despite being separated from the contact surface 220.

However, by including the first pin 150A and/or the second pin 150B, the ramifications of the magnetic device 160 de-mating from the contact surface 220 may be reduced or eliminated. In an example, the first pin 150A and the second pin 150B may interact with the magnetic device 160 if the magnetic device 160 de-mates from the contact surface 220. The first pin 150A and/or the second pin 150B may interfere with the rotation, or tumbling, of the magnetic device 160. By establishing the first distance 300 as being less than the thickness 310 of the magnetic device 160, the magnetic device 160 may remain in an elevated state (and in the proper orientation), despite the magnetic device not being mated with the contact surface 220. The binding of the magnetic device 160 between the first pin 150A and the second pin 150B may cause the magnetic device 160 to remain in an elevated state, despite the magnetic device not being mated with the contact surface 220.

Figure 5:
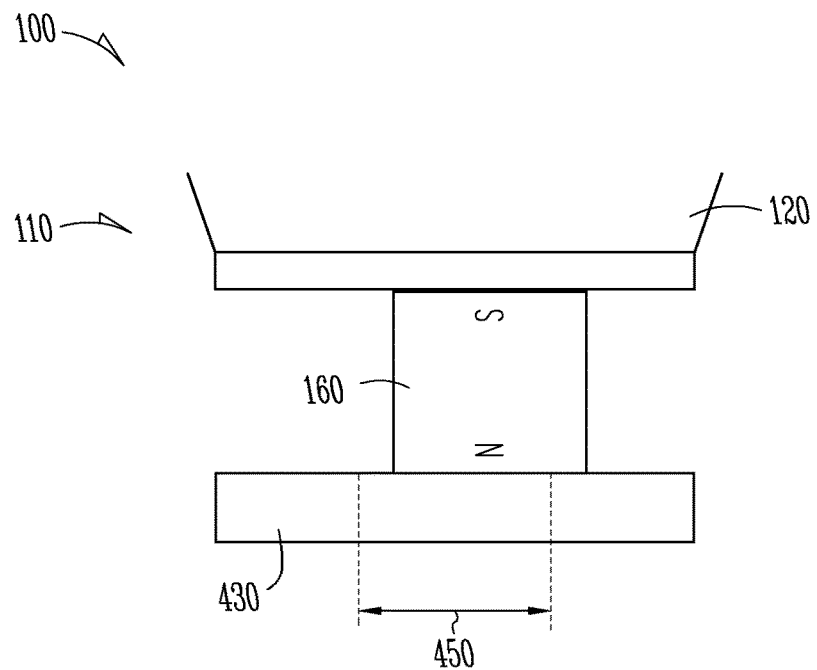
FIG. 5 illustrates an example placement of a magnetic device without using the system for handling magnetic devices of FIG. 1

FIG. 5 illustrates an example placement of a magnetic device without using the system 100 for handling magnetic devices of FIG. 1. In an example, the system 100 does not include the first pin 150A and/or the second pin 150B. The magnetic device 160 may be free to reorient itself due to the lack of an impediment provided by the first pin 150A and/or the second pin 150B. In an example, the second target surface 430 may be ferrous. The second target surface 430 may attract the magnetic device 160 when the magnetic device 160 is located proximate the second target surface 430. The attractive forces between the magnetic device 160 and the second target surface 430 may be so great that the magnetic device 160 is able to de-mate (e.g., separate) from the contact surface 220 (not shown). The de-mating of the magnetic device 160 from the contract surface may allow for the magnetic device to reorient itself. In an example, and as shown in FIG. 5, the magnetic device 160 may reorient itself such that the poles of the magnetic device 160 are not parallel with the surface of the second target surface 430 (e.g., as shown in FIG. 6). In an example, and as shown in FIG. 5, the magnetic device 160 may reorient itself such that the magnetic device 160 may be positioned outside of the second target position 450 (e.g., as shown in FIG. 6). The second target surface 430 may be the same as the first target surface 230 of FIG. 2.

FIG. 6 illustrates a different portion of the system 100 for handling magnetic devices of FIG. 1. In an example wherein the system 100 includes the first pin 150A and/or the second pin 150B, the magnetic device 160 may be prevented from reorienting itself from the position from which it was mated with the contact surface 220. The base 120 may be positioned proximate the second target surface 430 and/or the second target position 450. The magnetic device 160 may have followed the same path as the magnetic device 160 shown in FIG. 5, however, because the first pin 150A and/or the second pin 150B were included in the system 100, the magnetic device 160 was unable to reorient itself. Thus, the magnetic device 160 may be placed against the second target surface 430 (e.g., mated with the second target surface 430) at the second target position 450 in the desired orientation (e.g., with the poles of the magnetic device 160 aligned parallel to the second target surface 430). The vacuum applied to the vacuum line 200 (not shown) may be removed. Removing the vacuum from the vacuum line 200 may allow for the magnetic device 160 to remain mated with the second target surface 430 at the second target position 450 when the base 120 is repositioned.

Figure 7:
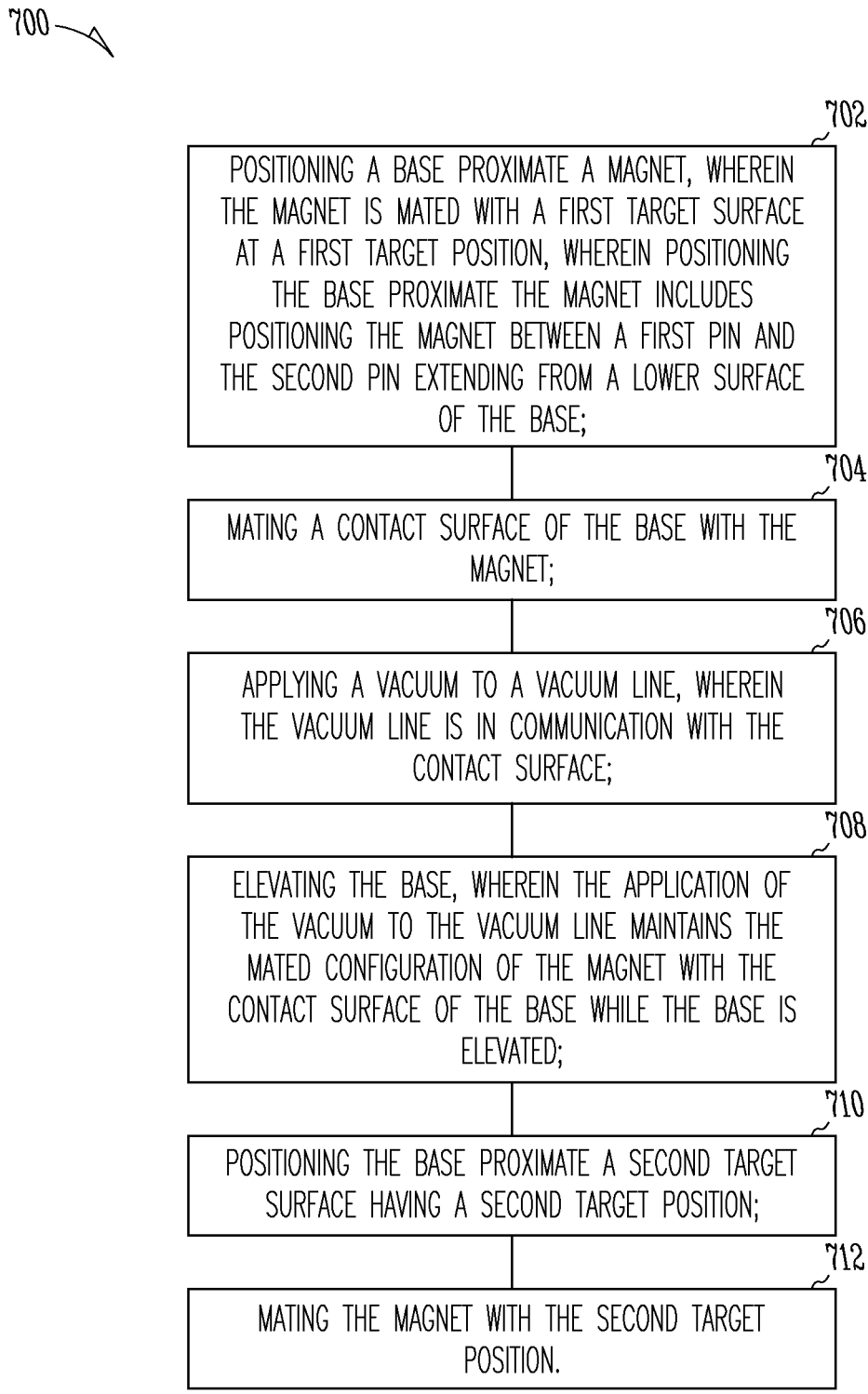
FIG. 7 is a flowchart of a method for positioning magnetic components.

FIG. 7 is a flowchart of a method 700 for positioning magnetic components. The method 700 may include at operation 702 positioning a base (e.g., the base 120 of FIGS. 1-6) proximate a magnet (e.g., the magnet 160 of FIGS. 1-6). The magnet may be mated with a first target surface (e.g., the first target surface 230 of FIG. 2) at a first target position (e.g., the first target position 250 of FIG. 2). Positioning the base proximate the magnet may include positioning the magnet between a first pin (e.g., the first pin 150A of FIGS. 1-4 and 6) and the second pin (e.g., the second pin 150B of FIGS. 1-4 and 6) extending from a lower surface (e.g., the lower surface 140 of FIGS. 1-4 and 6) of the base. The method 700 may include at operation 704 mating a contact surface (e.g., the contact surface 220 of FIGS. 2-4 and 6) of the base with the magnet. The method 700 may include at operation 706 applying a vacuum to a vacuum line (e.g., the vacuum line 200 of FIGS. 2 and 3). The vacuum line may be in communication with the contact surface.

The method 700 may include at operation 708 elevating the base. The application of the vacuum to the vacuum line may maintain the mated configuration of the magnet with the contact surface of the base while the base is elevated. The method 700 may include at operation 710 positioning the base proximate a second target surface (e.g., the second target surface 430 of FIGS. 4-6) having a second target position (e.g., the second target position 450 of FIGS. 4-6). The method 700 may include at operation 712 mating the magnet with the second target position. The method 700 may include removing the vacuum that may be applied to the vacuum line. The method 700 may include that the second target surface may be the same as the first target surface.

VARIOUS NOTES

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method for positioning magnetic components, comprising:
    positioning a base proximate a magnet having a first pole and a second pole, wherein the magnet is mated with a first target surface at a first target position, wherein positioning the base proximate the magnet includes positioning the magnet between a first pin and the second pin extending from a lower surface of the base and the first pin and the second pin are configured to engage with the magnetic component to inhibit reorientation of the magnetic with respect to the base;
    mating a contact surface of the base with the magnet having the first pole and the second pole;
    applying a vacuum to a vacuum line, wherein the vacuum line is in communication with the contact surface;
    elevating the base, wherein the application of the vacuum to the vacuum line maintains the mated configuration of the magnet with the contact surface of the base while the base is elevated;
    positioning the base proximate a second target surface having a second target position;
    mating the magnet with the second target position.

2. The method of claim 1, further comprising removing the vacuum that was applied to the vacuum line.

3. The method of claim 1, further comprising elevating the base with respect to the magnet mated with the second target position.

* * * * *